(12) United States Patent
Kuttner et al.

(10) Patent No.: US 9,184,763 B2
(45) Date of Patent: *Nov. 10, 2015

(54) CAPACITIVE DIGITAL TO ANALOG CONVERTER

(71) Applicant: Intel Mobile Communications GmbH, Neubiberg (DE)

(72) Inventors: Franz Kuttner, St. Ulrich (AT); Michael Fulde, Drobollach (AT)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,184

(22) Filed: Aug. 12, 2014

(65) Prior Publication Data

US 2014/0347203 A1 Nov. 27, 2014

Related U.S. Application Data

(62) Division of application No. 13/688,867, filed on Nov. 29, 2012, now Pat. No. 8,836,559.

(51) Int. Cl.
*H03M 1/66* (2006.01)
*H04B 1/04* (2006.01)
*H03M 1/80* (2006.01)
*H03M 1/68* (2006.01)

(52) U.S. Cl.
CPC .............. *H03M 1/66* (2013.01); *H03M 1/802* (2013.01); *H04B 1/04* (2013.01); *H03M 1/685* (2013.01)

(58) Field of Classification Search
CPC ..... H03M 1/765; H03M 1/802; H03M 1/806; H03M 1/66; H03M 1/685
USPC ...................................... 3/144, 150; 375/295
See application file for complete search history.

(56) References Cited

U.S. PATENT DOCUMENTS

| 5,519,396 | A | 5/1996 | Distinti |
| 6,163,283 | A | 12/2000 | Schofield |
| 6,628,219 | B2 | 9/2003 | Dedic |
| 6,831,582 | B2 | 12/2004 | Kuttner et al. |
| 6,919,858 | B2 | 7/2005 | Rofougaran |
| 6,937,848 | B2 | 8/2005 | Eloranta et al. |
| 7,176,823 | B2 | 2/2007 | Zabroda |
| 8,106,803 | B2 * | 1/2012 | Hurwitz et al. ............... 341/150 |
| 8,111,182 | B2 | 2/2012 | Kuttner |
| 8,238,845 | B2 * | 8/2012 | Hurwitz et al. ................. 455/91 |
| 8,446,184 | B2 | 5/2013 | Van Der Goes et al. |
| 8,604,958 | B2 | 12/2013 | Pfann et al. |
| 8,682,264 | B2 | 3/2014 | Kurose |
| 2004/0135714 | A1 | 7/2004 | Kuttner et al. |
| 2009/0140902 | A1 | 6/2009 | Park |

(Continued)

OTHER PUBLICATIONS

U.S. Appl. No. 13/688,980, filed Nov. 29, 2012.

(Continued)

*Primary Examiner* — Khai M Nguyen

(74) *Attorney, Agent, or Firm* — Eschweiler & Associates, LLC

(57) ABSTRACT

Some examples relate to a digital to analog converter (DAC). The DAC includes a digital signal input configured to receive a multi-bit digital input signal, and an array of cells. Respective cells in the array comprise respective capacitors. The DAC also includes a control circuit configured to, based on the multi-bit digital input signal, selectively induce one or more corresponding capacitors to discharge current to an output terminal of the DAC.

16 Claims, 8 Drawing Sheets

(56) References Cited

U.S. PATENT DOCUMENTS

| | | |
|---|---|---|
| 2011/0085616 A1 | 4/2011 | Kuttner |
| 2012/0286891 A1 | 11/2012 | Schimper et al. |
| 2013/0251068 A1 | 9/2013 | Boos et al. |

OTHER PUBLICATIONS

Non-Final Office Action dated Jan. 21, 2014 for U.S. Appl. No. 13/688,980.

Notice of Allowance dated Jun. 9, 2014 for U.S. Appl. No. 13/688,980.

U.S. Appl. No. 14/336,088, filed Jul. 21, 2014.

U.S. Appl. No. 13/688,662, filed Nov. 29, 2012.

Notice of Allowance dated Oct. 28, 2013 for U.S. Appl. No. 13/688,662.

Non-Final Office Action dated Jan. 14, 2014 for U.S. Appl. No. 13/688,867.

Notice of Allowance dated May 21, 2014 for U.S. Appl. No. 13/688,867.

Taoufiq Bellamine, 8 Bit Current Steering DAC, A project for ECE 547 "VLSI Design" Spring Semester 2007.

Non Final Office Action Dated Aug. 28, 2015 U.S. Appl. No. 14/336,088.

\* cited by examiner

CAPACITIVE DIGITAL TO ANALOG CONVERTER

REFERENCE TO RELATED APPLICATION

This application is a divisional of U.S. patent application Ser. No. 13/688,867 filed on Nov. 29, 2012.

BACKGROUND

In some applications, signals are processed digitally, converted to analog signals, and then mixed with a local oscillator signal to obtain a signal with a desired frequency. Wireless transmitters are an example of such an application, as signals are processed digitally at a so-called baseband frequency, converted to an analog signal via a digital to analog converter (DAC), and mixed with a radio frequency (RF) signal to obtain a radio frequency transmit signal, which is then passed through a power amplifier and transmitted via an antenna.

Previous transmitter architectures have been built as current steering DACs, wherein a controller changes control signals that are provided to gates of transistors in a cell array of the DAC, to thereby control the corresponding output current from the DAC. Unfortunately, these previous architectures suffer from shortcomings in that they exhibit non-linearities and low-efficiency, because the current sources waste a significant amount of power. As will be appreciated in more detail herein, the present application provides DACs that use capacitive cells, rather than current steering cells, to realize a more efficient solution.

DETAILED DESCRIPTION

Figure 1:
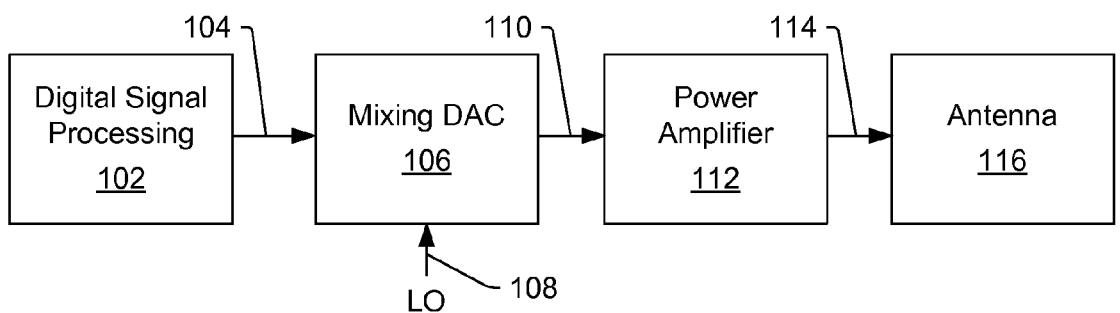
FIG. 1 shows a block diagram of a transmitter that makes use of a mixing digital to analog converter (DAC).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Digital-to-analog converters (DACs) convert a multi-bit digital signal to an analog signal. The number of bits present in the multi-bit digital signal corresponds to the number of discrete values between which the analog signal can vary. For example, for a 5 Volt (V) system, an eight bit digital signal can represent 256 (i.e., 2^8) different voltage values; where voltage values range from a minimum of 0V to a maximum of 5V with 254 voltage steps (i.e., a total of 256 voltage states), wherein each voltage step is spaced at 5/255 V from neighboring voltage steps. Thus, by varying the multi-bit digital input signal supplied to the DAC, the analog signals output by the DAC varies in a piecewise continuous manner rather than varying in a truly continuous analog manner. However these output DAC signals are still being referred to as analog signals because of their analog character. Analog signals as provided by a DAC may be either voltage signals, also referred to as signals in the voltage domain, or current signals, also referred to as signals in the current domain.

In some of the examples described hereinafter, DACs are described as comprising a plurality of cells that collectively deliver an analog signal. A cell generally refers to a portion of a DAC which generates a cell output signal, and the overall analog output signal of the DAC is based on the cell output signals of multiple cells or all cells of the DAC. To provide a smaller and more efficient architecture, the individual cells of the DAC in the present disclosure are capacitive DAC cells that include passive capacitor elements to generate current flow. In some implementations, this can save area by reducing the number of transformers needed to implement a transmitter. For example, conventional transmitter architectures often use at least two transformers: one at the output of the DAC and another just before the antenna. In the present disclosure, a transmitter can be implemented with only a single transformer just before the antenna. This reduces the silicon area needed for the transmitter, which tends to lower manufacturing costs and power consumption.

Turning now to the figures, FIG. 1 shows a simplified block diagram of a wireless transmitter 100. The wireless transmitter 100 comprises a digital signal processing circuit 102, for example a baseband processor, which processes digital signals and outputs a digital transmit signal 104. The digitally processed signals may be obtained by digitizing analog signals, for example by digitizing analog signals received from a microphone. The digitally processed signals may also be digital data signals in the form of a text message, webpage, digital image, digital music file, or any other digitally encoded signal.

After being generated, digital transmit signal 104 is supplied to a mixing DAC 106. The mixing DAC 106 can convert the digital transmit signal 104 to an analog signal (e.g., an analog current signal) and then mixes the digital transmit signal and/or analog signal with a local oscillator (LO) signal 108 to output a mixed analog signal 110. This mixed analog signal 110 is amplified by a power amplifier 112, and a resultant amplified mixed analog signal 114 is then wirelessly transmitted over an RF antenna 116.

It should be noted that the simplified block diagram of FIG. 1 shows only some features of a transmitter, and additional elements, for example filters or the like, may also be present, even though not illustrated in this simplified block diagram.

Figure 2:
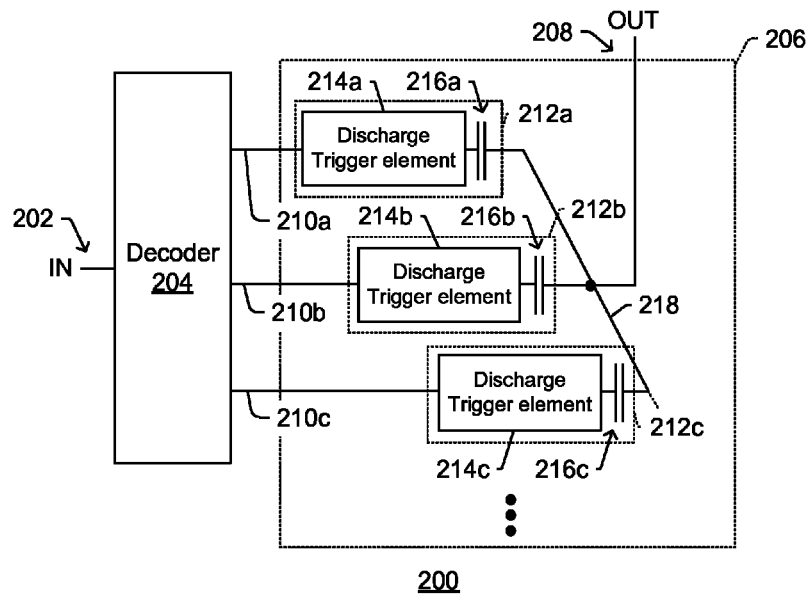
FIG. 2 shows a block diagram of a single-sided capacitive DAC.

FIG. 2 illustrates an example of a capacitive DAC 200 (e.g., mixing DAC 106 in FIG. 1). For purposes of simplicity and clarity, the LO signal previously shown in FIG. 1 has been left out, as it is optional with regards to non-mixing DAC functionality which is also possible with capacitive DAC 200. The capacitive DAC 200 includes a digital input 202, a decoder 204, a cell array 206, and an analog output 208. Digital input 202 can be a serial or parallel bus arranged to receive a multi-bit digital signal, which is fed to decoder 204. Control lines (210a-210c) couple the decoder 204 to respective cells (212a-212c) within cell array 206, wherein the respective cells include respective discharge trigger elements 214a-214c and respective capacitors 216a-216c. Typically, the capacitors 216a-216c each have the same unit capacitance value, such that each capacitor outputs an equal predetermined current when triggered by its corresponding discharge trigger element. The currents from any individually activated capacitors are summed on a current summing path 218, which is coupled to analog output 208. Although FIG. 2 only illustrates three cells for simplicity, it will be appreciated that a much larger number of cells is often included in array 206.

During operation of FIG. 2's capacitive DAC 200, the number of capacitors from which current discharge is triggered at any given time (and corresponding output current on analog output terminal 208) depends on the digital input supplied on input 202. For example, consider an example where the digital input is an eight bit digital value, and wherein the array 206 includes 255 cells. In such a case, a digital value of 0000_0000 (corresponding to a decimal value of zero) can be applied to the input 202, causing all discharge trigger elements to be off (i.e., no current is discharged from capacitors and the output current on output 208 is essentially zero). On the other hand, a digital value of 1111_1111, corresponding to a decimal value of 255) can be applied to the input 202, causing all discharge trigger elements to be activated triggering current discharge from all 255 unit capacitors. Thus, the digital value of 1111_1111 provides an output signal 208 which essentially is 255 times stronger than the output of a single capacitor. By changing the value of the multi-bit input signal provided to input 202 of capacitive DAC 200, a controller (e.g., DSP 102 in FIG. 1) can deliver a corresponding analog output signal on output 208 (e.g., for transmission over antenna 116 in FIG. 1). Because the individual cells 212 of capacitive DAC 200 are capacitive cells that include passive capacitor elements, rather than transistors that dictate current flow, FIG. 2's implementation can save area in some process technologies by reducing the number of transformers needed to implement DAC functionality. Thus, FIG. 2's architecture can provide some benefits not available with conventional architectures.

Figure 3:
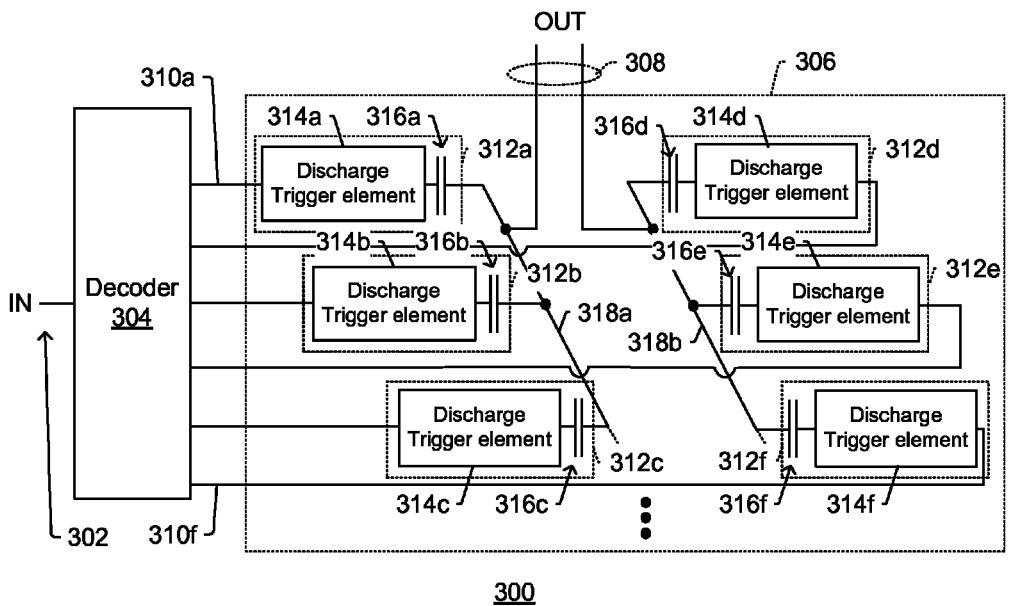
FIG. 3 shows a block diagram of differential capacitive DAC.

FIG. 3 shows an example of a capacitive DAC 300 having a differential output terminal 308. Similar to FIG. 2's example, current is selectively discharged from capacitors (316a-316f) based on control signals on control lines 310a-310f, which are based on the multi-bit digital input value on input 302. In this differential arrangement, some of the capacitors (316a-316c) selectively deliver current to a first terminal of differential output 308 via a first current summing path 318a; while other capacitors (316d-316f) selectively deliver current to a second terminal of the differential output 308 via a second current summing path 318b.

Figure 4:
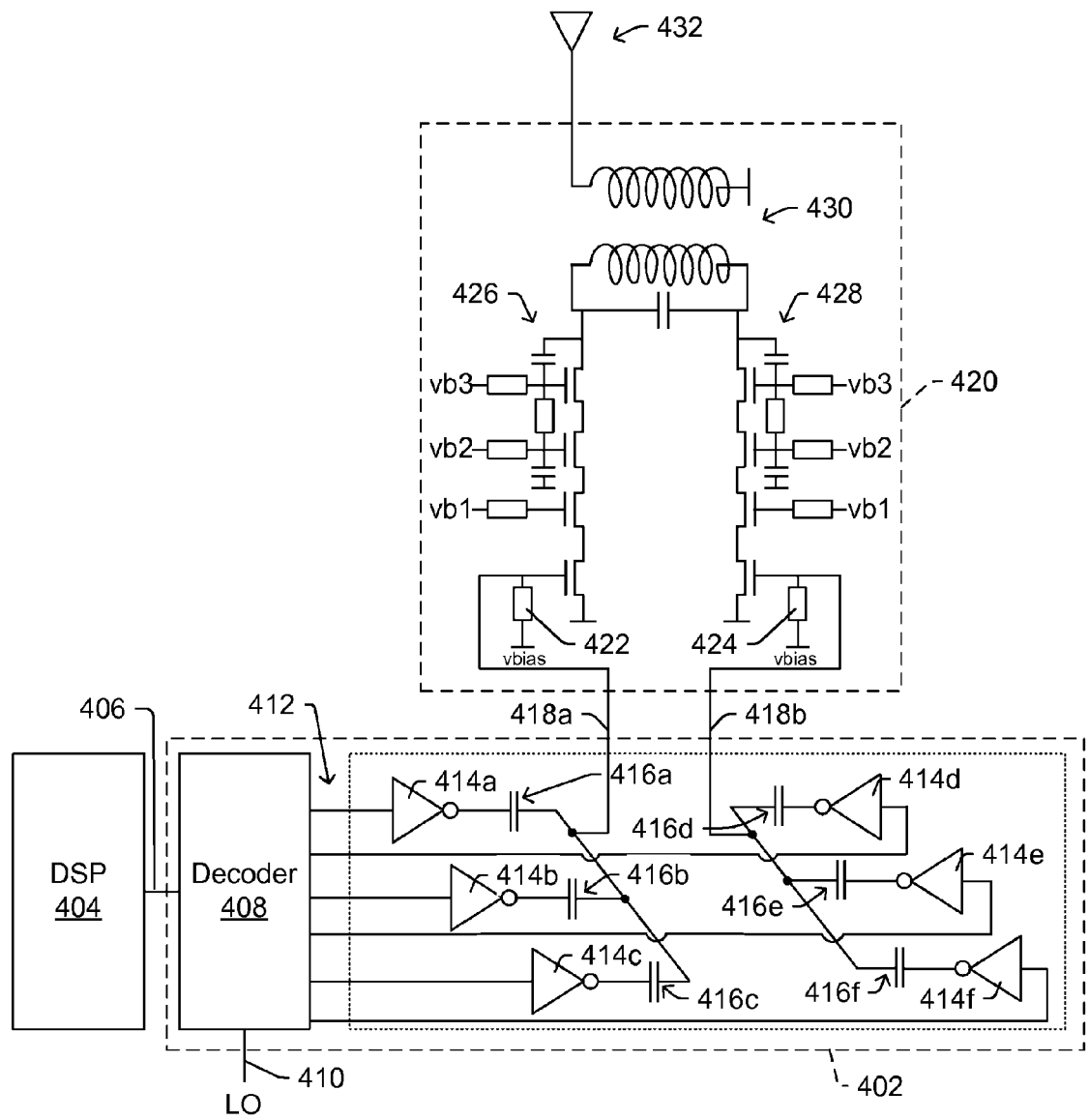
FIG. 4 shows a circuit diagram of a transmitter that makes use of a differential mixing DAC.

FIG. 4 shows a transmitter 400 that includes a differential capacitive DAC 402, wherein inverters are used as discharge trigger elements.

During operation of transmitter 400, DSP 404 provides a digital transmit signal in the form of a multi-bit digital signal 406. This multi-bit digital signal 406 is provided to decoder 408, which mixes the multi-bit digital signal with a local oscillator (LO) signal on 410, and generates corresponding control signals on control lines 412. The control signals control output states of respective inverters 414, which trigger the charging and discharging of respective capacitors 416. Currents are then summed and output to power amplifier 420 and antenna 432 for transmission.

For example, the decoder 408 can provide logical "0"s to the inverters 414a-414c coupled to first current summing path 418a, and concurrently provide logical "1"s to the inverters 414d-414f coupled to second current summing path 418b. The logical "0"s will be "flipped" by inverters 414a-414c such that a logical "1" high voltage is output from inverters 414a-414c to the plates of capacitors 416a-416c, thereby causing charge to build up on capacitors 416a-416c (assuming little or no charge is presently stored on capacitors). On the other hand, logical "1"s to inverters 414d-414f will drive a logical "0" low voltage to capacitors 416d-4146f on second current summing path 418b, thereby limiting charge (e.g., discharging charge) stored on capacitors 416d-416f. To discharge charged capacitors 416a-416c, the decoder 408 drives the signal inputs to inverters 414a-414c to a logical "1" high, which causes the outputs of inverters 414a-414c to go low thereby discharging capacitors 414a-414c and dumping current onto output node 418a. At the same time, the decoder 408 flips the inputs of other inverters 414d-414f to store charge on other capacitors 416c-416f. Operation continues in this fashion depending on the bits set on digital input at any given time.

The current output by the DAC 402 establishes a bias voltage on the input nodes of the power amplifier 420, due to the presence of bias resistors 422, 424. First and second strings of stacked transistors (426, 428), which each include four transistors in the illustrated example, and a transformer 430 help to build (amplify) the voltage established by the DAC 402. In this way, the power amplifier 420 provides an amplified signal at its output. This amplified signal is then transmitted via RF antenna 432.

Whereas conventional transmitters typically include one transformer between their DAC and power amplifier as well as a second transformer between their power amplifier and antenna; FIG. 4's transmitter is more streamlined in that it includes only a single transformer 430 between the power amplifier and antenna without a transformer between the DAC 402 and power amplifier 420. Due to the large on-chip area of transformers due to the large number of windings involved with them, FIG. 4's example saves significant chip area by eliminating a transformer compared to conventional solutions. Manufacturing costs and/or power consumption can be correspondingly reduced.

Figure 5:
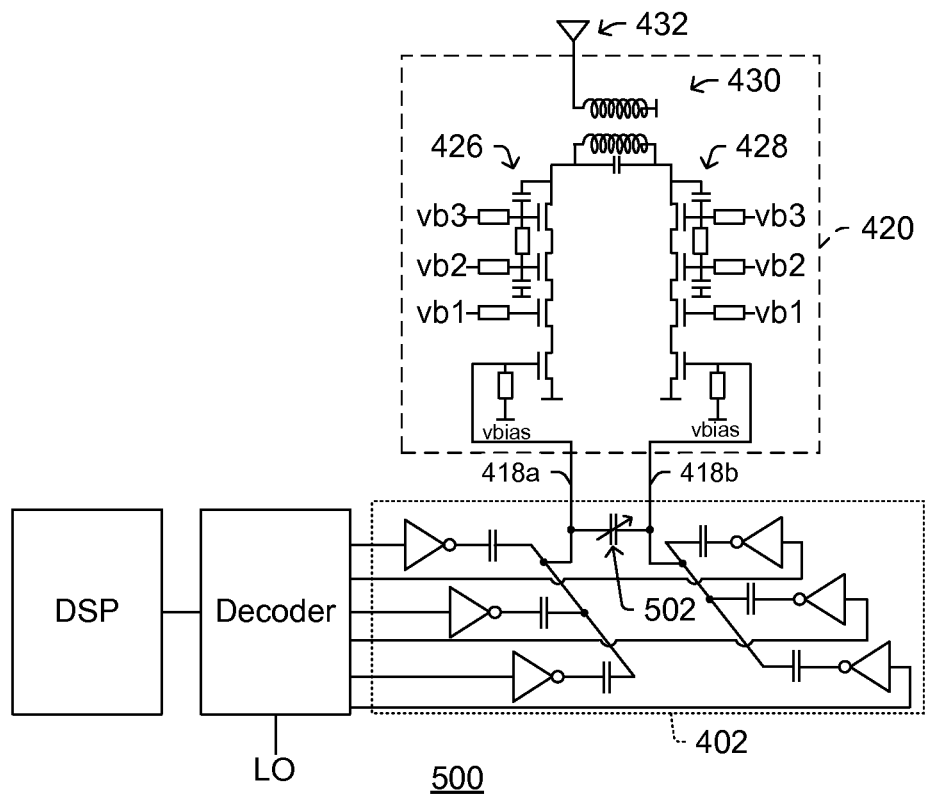
FIG. 5 shows a circuit diagram of a transmitter that makes use of a differential mixing DAC, which includes a variable capacitor to increase gain.

FIG. 5 shows another example of a transmitter 500, wherein a variable capacitor 502 is coupled between the current summing paths of the ADC. The capacitance of the variable capacitor 502 can be adjusted to increase the gain. In particular, the capacitance of the variable capacitor 502 is adjusted based on a difference between the actual transmitted power spectrum transmitted by the antenna 504, such as measured by a feedback receiver (FBR) coupled to the antenna 432, and a wanted transmitted power spectrum. The value of this variable capacitor 502 is in the same range as the sum of the other capacitors used in the DAC 402. In one example, the sum of the other capacitors in the DAC is 20 pf, so the capacitor 502 is adjustable between 0 . . . 40 pF. The realized range depends on application and wanted output power of the DAC.

Figure 6:
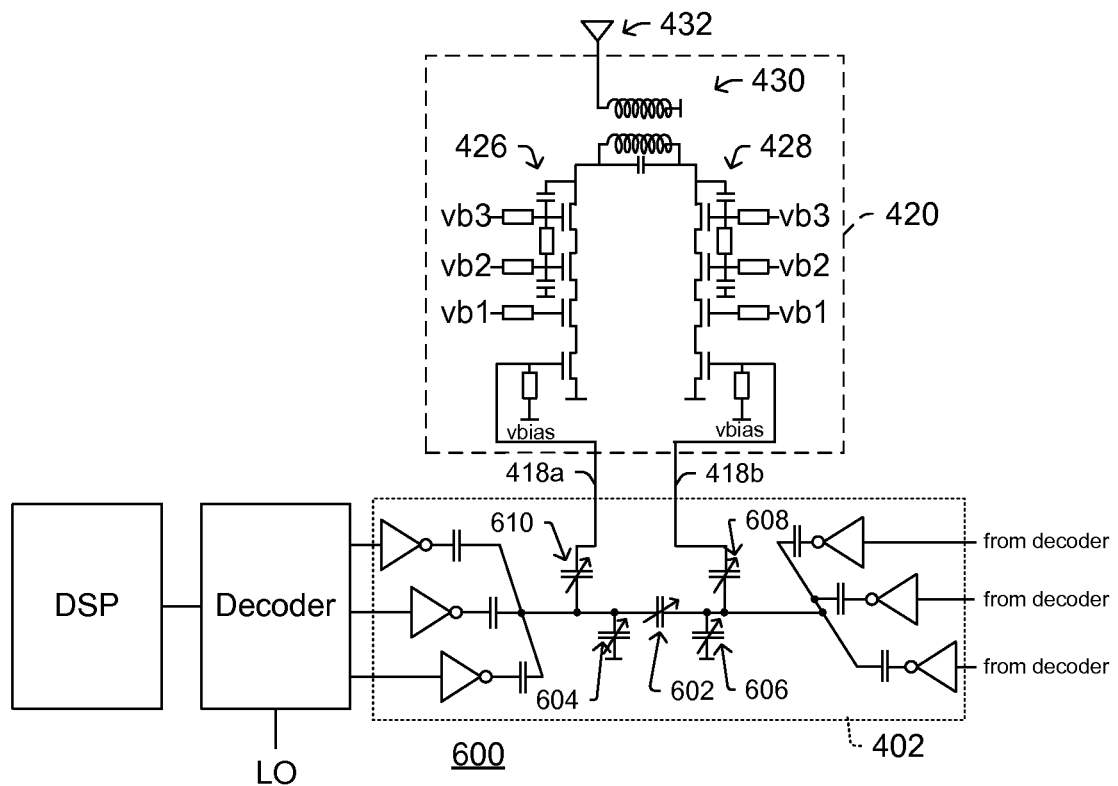
FIG. 6 shows a circuit diagram of another transmitter that makes use of a differential mixing DAC, which includes multiple variable capacitors to increase gain.

FIG. 6 shows another example of a transmitter 600, wherein variable capacitors 602-610 are coupled as shown and can be adjusted to increase the gain. In particular, the capacitance of the variable capacitors 602-610 are adjusted based on a difference between the actual transmitted power spectrum transmitted by the antenna 432, such as measured by a feedback receiver (FBR) coupled to the antenna 432, and a wanted transmitted power spectrum. The values of these variable capacitors 602-610 are in the same range as the sum of the other capacitors used in the DAC 402. In one example, the sum of the other capacitors in the DAC is 20 pf, so the capacitors 602-610 are adjustable between 0 . . . 40 pF. The realized range depends on application and wanted output power of the DAC.

Figure 7:
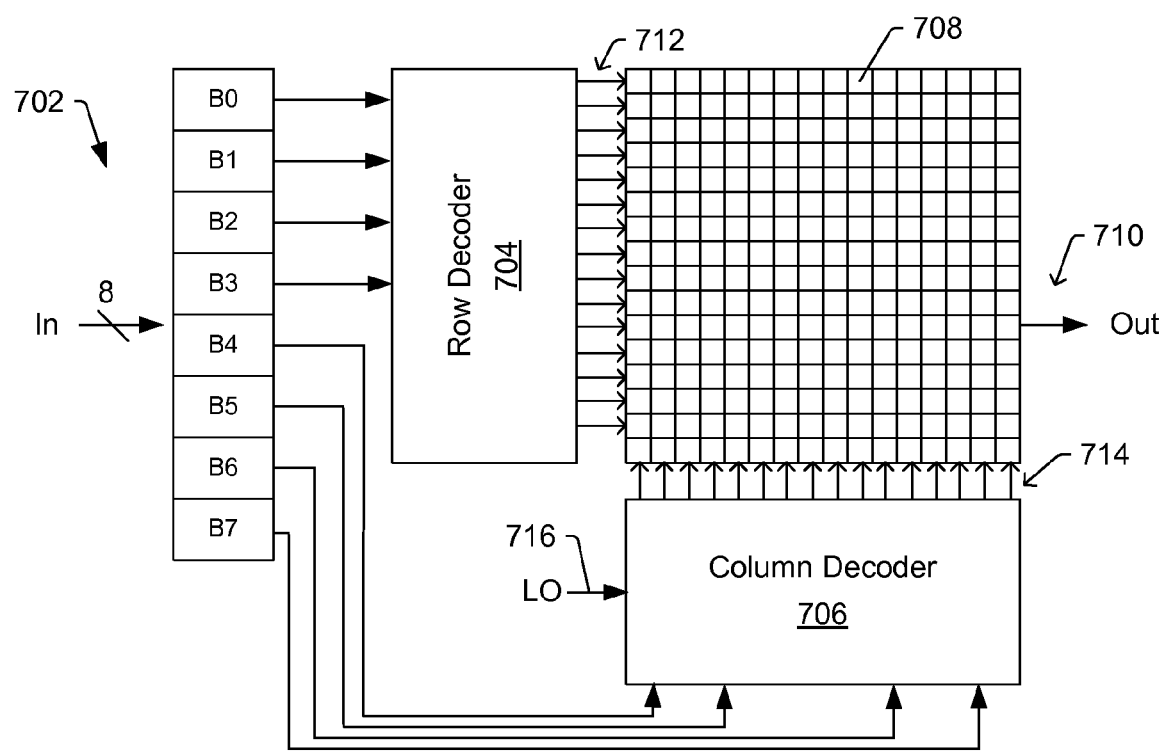
FIG. 7 shows a block diagram of a capacitive mixing DAC where a decoder of the DAC takes the form of row and column decoders.

FIG. 7 shows another architecture for a mixing DAC 700 (e.g., mixing DAC 106 in FIG. 1) that uses row and column decoders to selectively activate cells. The mixing DAC 700 includes an input 702, row and column decoders 704, 706, a cell array 708, and an output 710. The column and row decoders 704, 706 provide control signals in the form of row and column thermometer encoded control signals (712, 714, respectively), wherein at least one of the control signals is modulated based on a LO signal 716. Although FIG. 7 shows an example where the LO signal 716 is provided to the column decoder 706 such that at least one column thermometer control signal 714 is LO-modulated; the LO signal 716 can alternatively be provided to the row decoder 704 such that at least one row thermometer control signal 712 is LO modulated.

In the example of FIG. 7, input 702 receives a multi-bit digital signal in the form of an eight bit signal, the bits being denoted B0 to B7 in FIG. 7. Bits B0 to B3, which may be the least significant four bits, are fed to thermometer row decoder 704; while bits B4 to B7, which may be the most significant four bits, are fed to thermometer column decoder 706. Thermometer decoders 704, 706 control cell array 708 which comprises $2^8$, i.e. 256, cells. When activated by a control signal from the decoders 704, 706; a capacitor within each cell of cell array 708 outputs a predetermined current, wherein the predetermined current output by a cell is the same as that of each other cell. These currents from any individual activated cells are summed to generate analog output signal 710.

Figure 8:
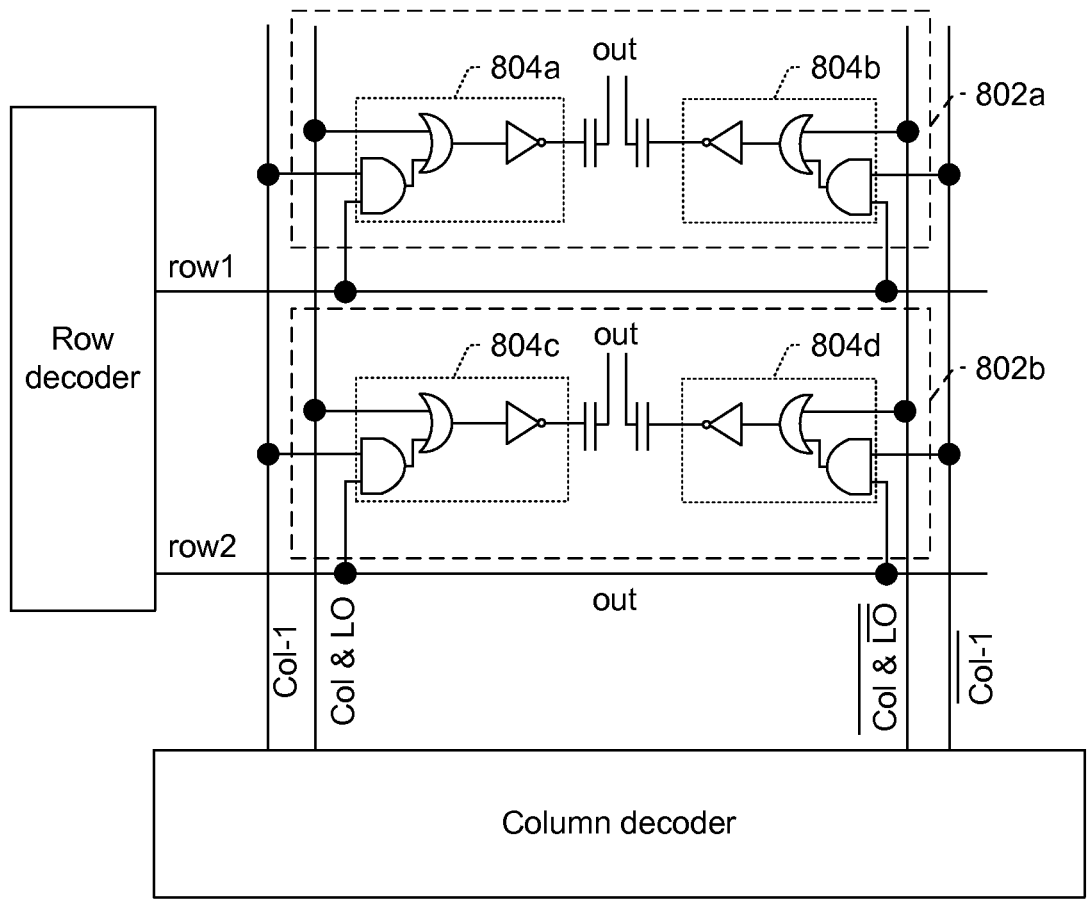
FIG. 8 shows a circuit diagram of a portion of a differential capacitive mixing DAC with row and column decoders.

FIG. 8 shows an example of mixing DAC 800 having row and column decoders, wherein the individual cells of the array include capacitors and trigger elements. For simplicity, FIG. 8's example shows only a single column having two rows (i.e., two cells 802a, 802b), wherein the cells have a differential output. In this example, each trigger element 804a-804d includes an AND-OR gate and an inverter, which are triggered based on control signals (row1, row2, col-1, and col&LO signals, and their respective complements as indicated by the bar marks thereover). Other examples typically include more rows and more columns, and can be single-ended or differential. Because FIG. 8's control signals are modulated based on local-oscillator (LO) signal, the DAC 800 exhibits extremely reliable behavior.

Figure 9:
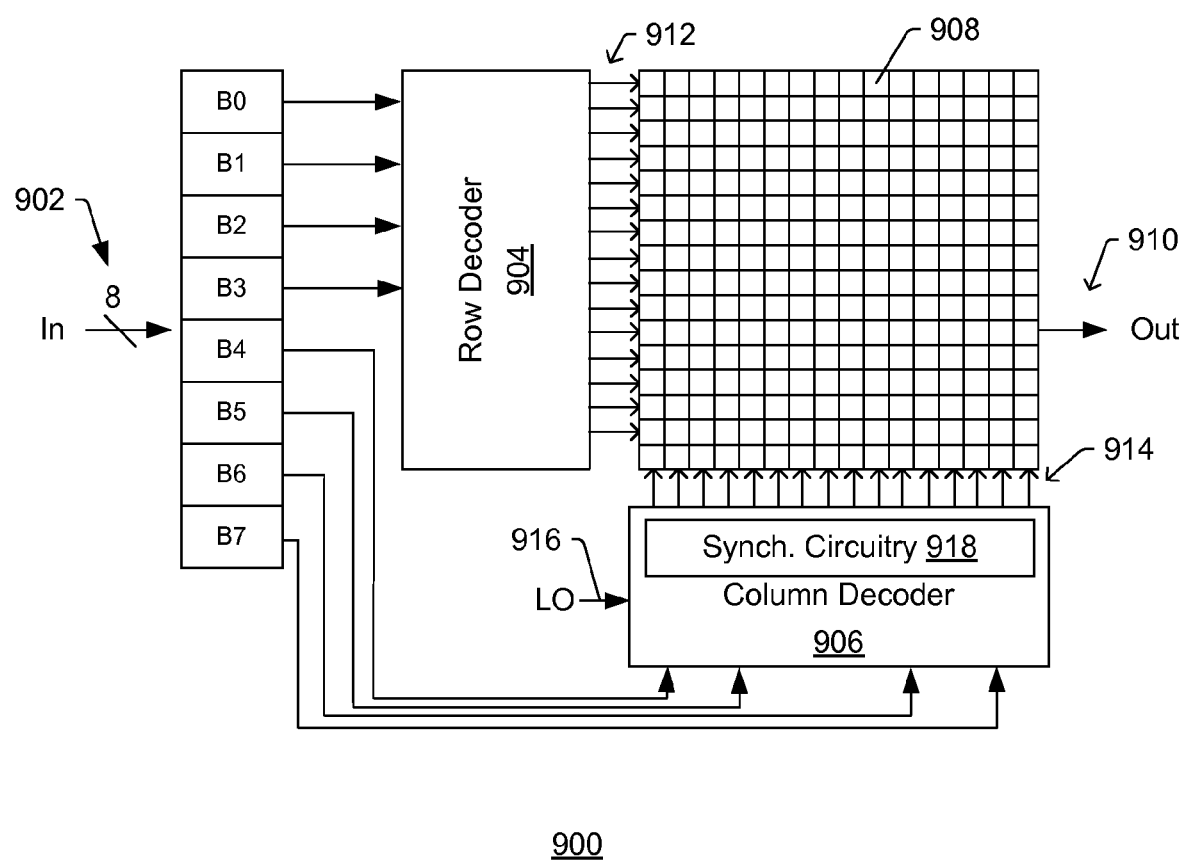
FIG. 9 shows a circuit diagram of a portion of a capacitive mixing DAC with row and column decoders, wherein the column decoder includes a synchronization circuit.

FIG. 9 shows an example of a mixing DAC 900 having a synchronization circuit 918 to limit glitches and other timing imperfections. Like FIG. 8's example, FIG. 9's mixing DAC 900 includes an input 902, row and column decoders 904, 906 which provide row and column thermometer encoded control signals 912, 914 to cell array 908, and an output 910. As will be appreciated in greater detail below, the synchronization circuit 918 in the column decoder 906 modulates the column control signals 914 provided to the cell array 908 based on a local oscillator (LO) signal 916. Although the synchronization circuit 918 is illustrated in the column decoder 906 in FIG. 9, the synchronization circuit 918 could also be included in the row decoder 904 in other implementations. In such alternative arrangements, the row control signals 912 can be modulated with the LO signal 916, rather than the column control signals 914 being LO modulated as illustrated. In still other implementations, both the row and column control signals could be LO-modulated.

Figure 10:
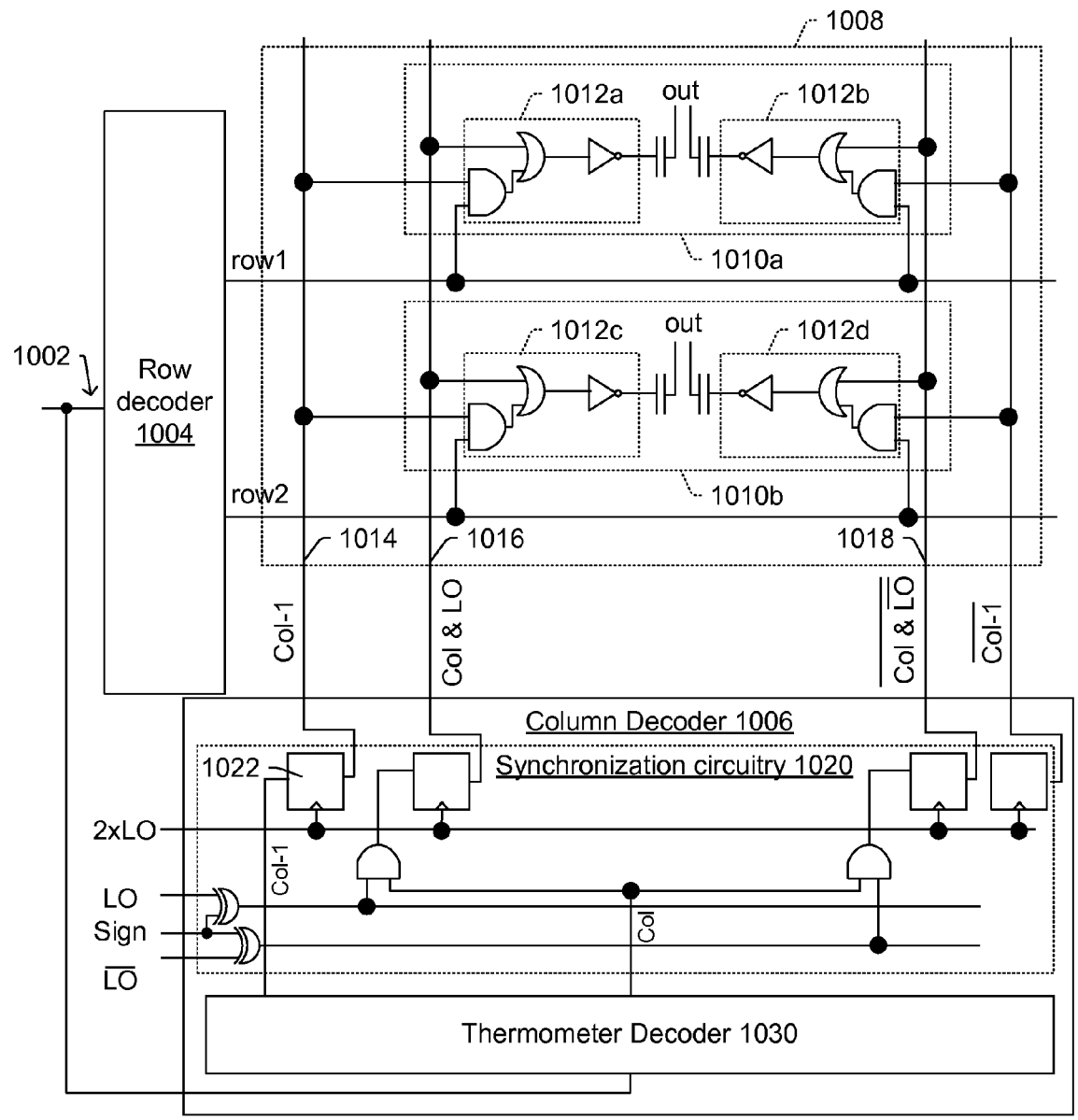
FIG. 10 shows a circuit diagram of a portion of a differential capacitive mixing DAC with row and column decoders, wherein the column decoder includes a synchronization circuit.

FIG. 10 shows a more detailed implementation of a mixing DAC 1000 having a synchronization circuit 1020. Like FIG. 9's example, FIG. 10's mixing DAC 1000 includes an input 1002, row and column decoders 1004, 1006 which provide thermometer encoded control signals to cell array 1008. The array includes cells (e.g., 1010a, 1010b) having discharge trigger elements (1012a-1012d) and corresponding capacitors. In this example, each discharge trigger element includes an AND-OR gate and an inverter, which are triggered based on the control signals (row1, row2, col-1, and col&LO signals, and their respective complements as indicated by the bar marks thereover). Other examples typically include more rows and/or more columns, and can be single-ended or differential. Because FIG. 10's control signals are modulated based on local-oscillator (LO) signal, the DAC 1000 exhibits extremely reliable behavior.

Un-modulated "row" control signals are provided on "row" control lines (row1, row2), which are coupled to row thermometer decoder 1004. An un-modulated "col" control line (col-1) 1014 and LO-modulated "col" control lines (col&LO and col&LO_bar) 1016, 1018 are coupled to column thermometer decoder 1030. By setting the control signals on control lines (row1, row2, col-1, col&LO, and col&LO_bar) to logic 1 or logic 0, the row and column thermometer decoders 1004, 1030 may selectively activate and deactivate cells of array 1008. It is to be noted that the above-described control logic using ANDOR-gates is only one example for a discharge trigger element, and other implementations are equally possible.

Notably, the synchronization circuit 1020 in the column decoder 1006 latches control signals using a series of flip-flops (e.g., 1022), wherein the flip-flops are clocked at twice the LO frequency. The flip flops could also be clocked at higher frequencies, although this would tend to consume additional power.

It should also be noted that in various illustrated implementations NMOS transistors have been depicted which are put into a conducting state between source and drain when a high voltage (e.g., logical 1) is supplied to its gate; and which are put into a non-conducting state between source and drain when a low voltage (e.g., logical 0) is supplied to its gate. In other examples, however, the control logic may be reversed, and PMOS transistors may be used. In still other examples, PMOS transistors may be used instead of NMOS transistors in cases where for example logic 1 is associated with a low voltage and logic 0 is associated with a high voltage. In still other examples, instead of some or all of the MOS transistors shown other types of transistors, for example bipolar transistors, may be used. For example, in case of bipolar transistors a base terminal serves as control terminal.

Thus, it will be appreciated that one example relates to a digital to analog converter (DAC). The DAC includes a digital signal input configured to receive a multi-bit digital input signal, and an array of cells. Respective cells in the array comprise respective capacitors. The DAC also includes a control circuit configured to, based on the multi-bit digital input signal, selectively induce one or more corresponding capacitors to discharge current to an output terminal of the DAC.

Another example relates to a transmitter. The transmitter includes a digital signal processing unit to provide a digital transmission signal. A digital to analog converter (DAC)

includes an array of cells, wherein respective cells comprise respective capacitors and respective discharge trigger elements. The DAC also includes a decoding circuit configured to, based on the digital transmission signal, selectively trigger one or more of the discharge trigger elements to induce one or more corresponding capacitors to discharge current onto a current summing path coupled to an output terminal of the DAC. A power amplifier is coupled to the output terminal of the DAC.

It is to be understood that in the description of examples contained herein any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some examples, but may also be fully or partially implemented in a common circuit or common integrated circuit in other examples, or in some cases may also be implemented jointly by programming a processor accordingly.

It should be noted that the drawings are provided to give an illustration of some aspects and features of examples of the present invention and are to be regarded as schematic only. In particular, the elements shown in the drawings are not necessarily to scale with each other, and the placement of various elements in the drawings is chosen to provide a clear understanding of the respective example and is not to be construed as necessarily being a representation of the actual relative location of the various components and elements shown. The features of the various examples described herein may be combined with each other. On the other hand, describing an example with a plurality of features is not to be construed as indicating that all those features are necessary for practicing the present invention, as other examples may comprise less features and/or alternative features.

What is claimed is:

1. A digital to analog converter (DAC) comprising:
   a digital signal input configured to receive a multi-bit digital input signal,
   an array of cells, wherein a cell of the array of cells comprises at least one capacitor; and
   a control circuit configured to, based on the multi-bit digital input signal, selectively trigger at least one capacitor in the array of cells to discharge current to an output terminal of the DAC,
   wherein the cell of the array further comprises at least one discharge trigger element coupled to the at least one capacitor of the cell, and wherein the control circuit is configured to, based on the multi-bit digital input signal, trigger the at least one discharge trigger element to trigger the at least one capacitor in the array of cells to discharge the current to the output terminal of the DAC, and
   wherein the at least one discharge trigger element comprises an inverter.

2. The DAC of claim 1, further comprising:
   a current summation path coupling the capacitors of the array to the output terminal of the DAC.

3. The DAC of claim 2, wherein a number of capacitors triggered to discharge current from the array of cells are selected so that a current level discharged to the output terminal of the DAC at a given time corresponds to a digital data value of the multi-bit digital input signal at a corresponding time.

4. The DAC of claim 3, wherein the capacitors in the array of cells are unit capacitors each having an equal capacitance value.

5. A method, comprising:
   receiving a multi-bit digital input signal,
   based on the multi-bit digital input signal, selectively triggering one or more of at least one capacitor using an inverter to discharge current to an output terminal of a digital-to-analog converter; and
   summing the current discharged from the one or more capacitors at a current summing path to discharge a current level to the output terminal of the DAC at a given time, wherein the discharged current level corresponds to a digital data value of the multi-bit digital input signal at a corresponding time.

6. The method of claim 5, wherein the (DAC) comprises:
   an array of cells, wherein respective cells comprise respective unit capacitors and respective discharge trigger elements, wherein the discharge trigger elements comprise inverters, respectively; and
   a decoding circuit configured to, based on the multi-bit digital input signal, selectively trigger one or more of the discharge trigger elements to trigger one or more corresponding capacitors to discharge current onto the current summing path coupled to the output terminal of the DAC.

7. A transmitter, comprising:
   a digital signal processing unit configured to provide a digital transmission signal;
   a digital to analog converter (DAC) comprising: an array of cells, wherein a cell comprises at least one capacitor and at least one discharge trigger element operably coupled to the at least one capacitor;
   wherein the DAC further comprises a decoding circuit configured to, based on the digital transmission signal, selectively trigger one or more of the at least one discharge trigger element to trigger one or more respective capacitors to discharge current onto a current summing path coupled to an output terminal of the DAC, wherein a current level of the discharged current at a given time corresponds to a digital data value of the digital transmission signal at a corresponding time; and
   a string of stacked resistive elements serially coupled between the input terminal of a transformer and the current summing path.

8. The transmitter of claim 7, further comprising:
   a bias element coupled to the current summing path to boost voltage provided to the string of stacked resistive elements.

9. The transmitter of claim 7, wherein the string of stacked resistive elements comprises a plurality of transistors arranged in series to boost a voltage from the current summing path upwards to the input of the transformer.

10. The transmitter of claim 9, wherein there is an absence of an inductor between the current summing path and the string of stacked resistive elements.

11. The transmitter of claim 7, wherein the current summing path is a differential current summing path having two legs coupled to different capacitors.

12. A transmitter, comprising:
    a digital signal processing unit configured to provide a digital transmission signal;
    a digital to analog converter (DAC) comprising: an array of cells, wherein a cell comprises at least one capacitor and at least one discharge trigger element operably coupled to the at least one capacitor; and wherein the DAC further comprises a decoding circuit configured to, based on the digital transmission signal, selectively trigger one or more of the at least one discharge trigger element to trigger one or more respective capacitors to discharge current onto a current summing path coupled to an output terminal of the DAC, wherein a current level of the discharged current at a given time corresponds to a digital data value of the digital transmission signal at a corresponding time;

wherein the current summing path is a differential current summing path having two legs coupled to different capacitors; and an adjustable capacitor coupled between the two legs of the differential current summing path.

13. A transmitter, comprising:

a digital signal processing unit configured to provide a digital transmission signal;

a digital to analog converter (DAC) comprising: an array of cells, wherein a cell comprises at least one capacitor and at least one discharge trigger element operably coupled to the at least one capacitor; and wherein the DAC further comprises a decoding circuit configured to, based on the digital transmission signal, selectively trigger one or more of the at least one discharge trigger element to trigger one or more respective capacitors to discharge current onto a current summing path coupled to an output terminal of the DAC, wherein a current level of the discharged current at a given time corresponds to a digital data value of the digital transmission signal at a corresponding time.

14. A transmitter, comprising:

a digital signal processing unit configured to provide a digital transmission signal;

a digital to analog converter (DAC) comprising: an array of cells, wherein a cell comprises at least one capacitor and at least one discharge trigger element operably coupled to the at least one capacitor;

wherein the DAC further comprises a decoding circuit configured to, based on the digital transmission signal, selectively trigger one or more of the at least one discharge trigger element to trigger one or more respective capacitors to discharge current onto a current summing path coupled to an output terminal of the DAC, wherein a current level of the discharged current at a given time corresponds to a digital data value of the digital transmission signal at a corresponding time; and a plurality of synchronization elements to synchronize control signals over multiple rows or multiple columns prior to delivery of the synchronized control signals to the multiple rows or multiple columns.

15. The transmitter of claim 14, wherein the synchronization elements is synchronized on a clock derived from a local oscillator (LO) frequency provided to a LO.

16. The transmitter of claim 14, wherein the respective capacitors are respective unit capacitors each having an equal capacitance value.

* * * * *